Figure 1:
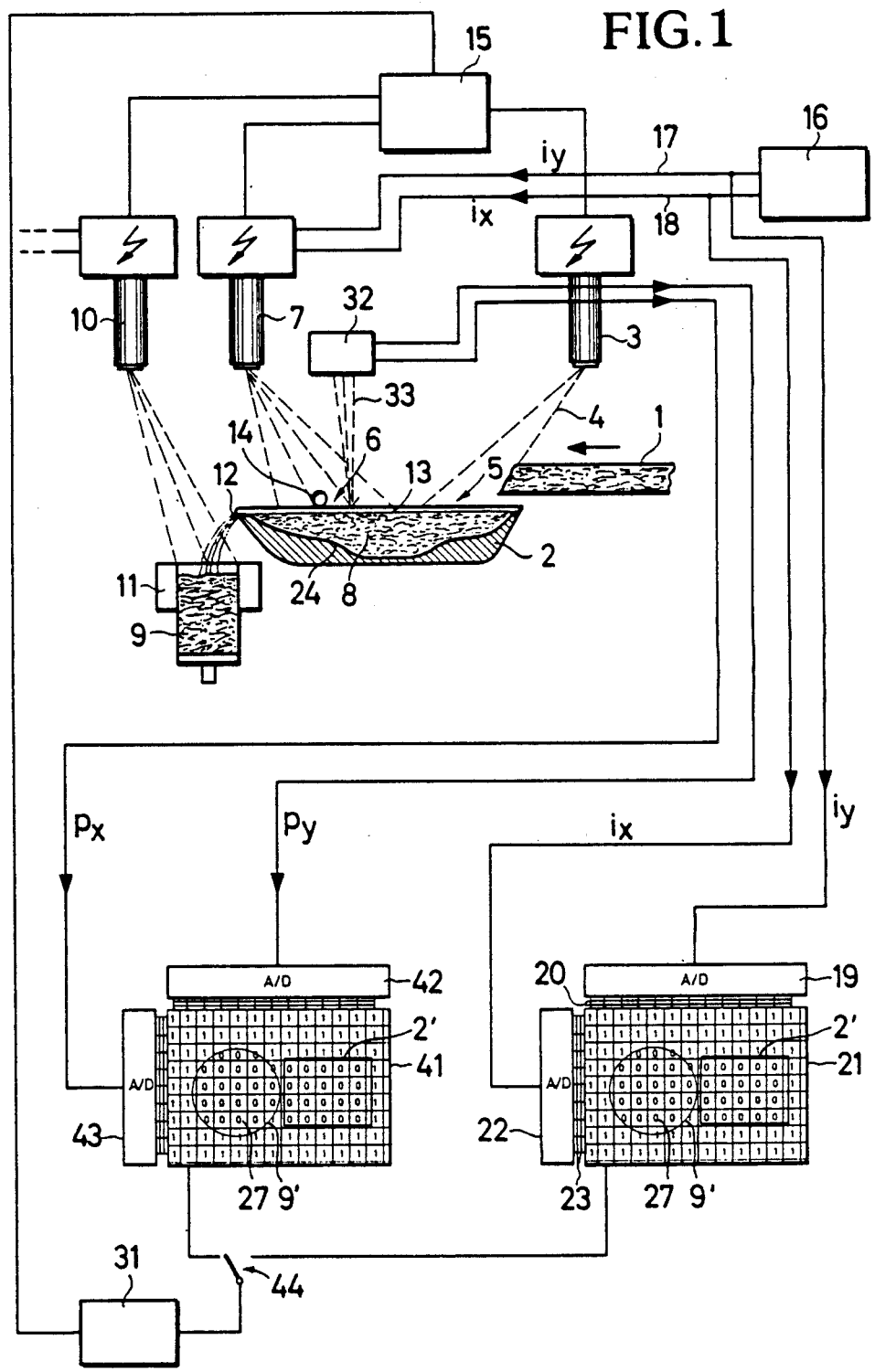

United States Patent [19]

Bittenbrünn et al.

[11] Patent Number: 4,973,818

[45] Date of Patent: Nov. 27, 1990

[54] DEVICE AND METHOD FOR THE CONTROL AND MONITORING OF AN ELECTRON BEAM FOR METAL WORKING

[75] Inventors: Harald Bittenbrünn, Hanau; Friedrich-Werner Thomas, Gelnhausen; Gernot Thorn, Hanau, all of Fed. Rep. of Germany

[73] Assignee: Leybold Aktiengesellschaft, Hanau, Fed. Rep. of Germany

[21] Appl. No.: 327,830

[22] Filed: Mar. 23, 1989

[30] Foreign Application Priority Data

Mar. 26, 1988 [DE] Fed. Rep. of Germany ....... 3810391

[51] Int. Cl.$^5$ .............................................. B23K 15/00
[52] U.S. Cl. ........................... 219/121.28; 219/121.25; 219/121.29; 219/121.16; 219/121.17; 373/15; 373/16
[58] Field of Search ....................... 219/121.25, 121.28, 219/121.30, 121.16, 121.17, 121.12, 121.35; 373/14, 15, 16, 17; 250/492.22

[56] References Cited

U.S. PATENT DOCUMENTS

| | | | |
|---|---|---|---|
| 3,513,285 | 5/1970 | Imura | 219/121.3 |
| 4,560,854 | 12/1985 | Domian et al. | 219/121.3 |
| 4,791,301 | 12/1988 | Bauer et al. | 219/121.23 X |

FOREIGN PATENT DOCUMENTS

| | | |
|---|---|---|
| 0184680 | 6/1986 | European Pat. Off. . |
| 3339906A1 | 6/1984 | Fed. Rep. of Germany . |
| 221473A1 | 4/1985 | German Democratic Rep. . |
| 242427A1 | 1/1987 | German Democratic Rep. . |
| 249923A1 | 9/1987 | German Democratic Rep. . |
| 249924A1 | 9/1987 | German Democratic Rep. . |
| 0032419 | 2/1983 | Japan ............................ 250/492.22 |

OTHER PUBLICATIONS

"Hi-Tech Processes and Equipment-Developments and Future Prospects", Authored by Dr. M. Booth, Published in Metallurgical Furnaces Supplement (Dec. 1987, pp. S35, S36, S38, S40).

"A Novel and Inherently Fast Digital Method for Use in Position-Sensitive Detection", Authored by W. M. Farrell, J. A. Aiken and Crowe, Published in Journal of Physics and Engineering: Scientific Instruments (vol. 22, 1989, pp. 283-286).

Panzer, S. and M. Mueller, Carl Hanser Verlag, Munich 1988, HTM 43 (1988) 2, pp. 103-110.

Panzer, S. and S. Schiller, Carl Hanser Verlag, Munich 1987, HTM 42 (1987)5, pp. 293-300.

Schiller, S., Metal Progress, Apr. 1986, pp. 39-40.

Schiller, S. and S. Panzer, Mar. 1985, Metall, vol. 39, No. 3, pp. 227-232.

Stephan, H., Nov. 1971, Neue Huette, vol. 16, No. 11, pp. 650-657.

Zenker, R. and M. Mueller, Apr. 1987, Neue Huette, vol. 32, No. 4, pp. 127-134.

Primary Examiner—C. L. Albritton
Attorney, Agent, or Firm—Limbach, Limbach & Sutton

[57] ABSTRACT

A device and a method for the control and monitoring of a deflectable electron beam is provided for the working of metal wherein the electron beam is not permitted to go beyond an allowed working area. With this device with the aid of a Teach-In method the limits are entered into a computer. The computer generates an image of the areas allowed for the electron beam in a particular area of a special memory. This memory is so organized that the addresses of the point of the particular areas correspond to the digitized coordinates of the point of impingement of the electron beam. The characterization of the allowed and forbidden target points of the electron beam takes place through placing or deleting respectively the assigned bits in the special memories.

12 Claims, 2 Drawing Sheets

DEVICE AND METHOD FOR THE CONTROL AND MONITORING OF AN ELECTRON BEAM FOR METAL WORKING

The invention relates to a device and a method for the control and monitoring of a deflectable electron beam for metal working, for example hardening, melting, vaporizing, etc.

For the general of metals of high purity, as they are required for example in aircraft construction, high-vacuum electron beam melting installations are particularly suitable The scale of metals melted and purified in electron beam melting installations extends from the radioactive metals over the nonferrous heavy metals, different steel qualities up to the reactive and refractory metals and their alloys.

As far as the quality of a ingot melted by means of an electron beam is concerned, which is characterized by the ingot surface, the uniformity of the crystalline ingot structure, and the homogeneity of the chemical composition, further the purity of gases, undesirable trace elements, macro- and microcrystalline inclusions, and other impurities as well as the improved mechanical properties, such as ductility and anisotropy of the rigidity values, it is hardly surpassed by another method.

In order to increase this quality of a melted ingot, different welding, melting, and surface hardening methods have been suggested (DE-OS 33 39 906, DD-PS 249 923, DD-PS 221 473, DD-PS 249 924, DD-PS 242 427; S. Schiller and S. Panzer: "Härten von Oberflächenbahnen mit Elektronenstrahlen" in HTM 42, 2987, 5, pages 293 to 300; S. Panzer and M. Müller: "Härten von Oberflächen mit Elektronenstrahlen", HTM 43, 1988, 2, pages 103 to 111; S. Schiller and S. Panzer: "Thermische Oberflächenmodifikation metallischer Bauteile mit Elektronenstrahlen", METALL, Vol. 39, No. 3, March 1985, pages 227 to 232; Rolf Zenker and Matthias Möller: "Randschichthärten mit Elektronenstrahlen-Verfahrenstechnische Möglichkeiten und werkstofftechnische Effekte", Neue Hütte, Vol. 32, No. 4, April 1987, pages 127 to 134; Siegfried Schiller: "Electron Beam Systems Scan at High Speeds", Metal Progress, April 1986, pages 39/40). However, these methods have very little to do with the focal spot positioning of an electron beam and the possibility connected therewith of crucible melting.

It is furthermore known to apply the electron beam melting for simple ingot melting, for drip melting, with the overflow melt, in multi-continuous casting, in pelletizing, in melting in two separate chambers, and for purification (Neue Hütte, No. 11, Vol. 16, November 1971, pages 650 to 657). In all of these methods it is important that the electron beam, which has a given action radius through its deflection unit, impinges on the metal to be melted only within given spatial limits. These limits can be given through a crucible edge, the contours of an intermediate pan or the edge of a continuous casting mould. If the electron beam impinges on objects outside of these limits, great damage can occur.

For the representation of a crucible edge it is already known to provide a memory connected to a screen in which the contours of the crucible are stored (DE-OS 35 38 857). Herein the contours of the crucible are determined by means of the Teach-In method wherein, for example, the acquisition of the contours of a rectangular crucible takes place in the manner that an electron beam is directed manually into the crucible corners and a computer device determines the total contour through linear interpolation between the individual corner positions. A way of how the electron beam is to be prevented from not leaving a particular area is not indicated in this known device, which refers to the input of a nominal position value for the impingement point of an electron beam.

In order to permit an electron beam to impinge only on the inner area of a crucible, it is in many cases sufficient to define the inner area through an appropriate nominal value input at the x-y deflection of the electron beam. Since, however, a deviation between nominal and actual value always exists, going beyond a crucible edge can be prevented with greater certainty if the actual value of the impingement point of the electron beam is acquired.

A device for recognizing the actual value of the impingement site of an electron beam on a target is already known (EP-A1-0 184 680). Herein the X-rays originating from the impingement site are recognized by a detector which is connected with a special evaluation circuit. With the aid of an imaging system all positions which the impingement site can assume are acquired and given to the sensor area of a position-sensitive detector. In this device, however, also no solution is given for the problem of preventing the electron beam from going beyond given limits.

The invention is therefore based on the task of creating a device with which it is possible to let an electron beam impinge on matter only within predeterminable contours.

This task is solved in accordance with the features of Patent claim 1.

The advantage achieved with the invention comprises in particular that the electron beam does not reach into forbidden zones and there cause damage, without requiring mechanical supporting means like diaphragms and the like. An additional advantage is that the particular acquired actual position of the electron beam impingement point does not need to be given into analog crucible contour comparison circuits, which certainly could lead to a rapid switching off of the electron beam, but would prevent arbitrarily variable contours from being storable in a memory. For the acquisition and storage of variable contours according to the Teach-In method a computer is suitable in particular manner which, however, due to the limited computer speed for the comparison of the actual position of the electron beam with the permitted positions is not suitable. With the deflection frequencies of up to 1000 Hz required for the working of materials by electron beam, corresponding 1 ms period of the deflection cycle and a resolution of 1% of the rotation, only a computing time of 1 microsecond remains for calculating the instantaneous position of the electron beam relative to the border. This task requires extensive calculations of vector functions in the x-y plane. This task could be carried out with a high-performance computer, however, the computer in that case would be occupied with this monitoring function alone. With the invention, in contrast, it is possible to monitor whether the impingement point of the electron beam is in the permitted area without requiring a computer during the active process phase.

Figure 2:
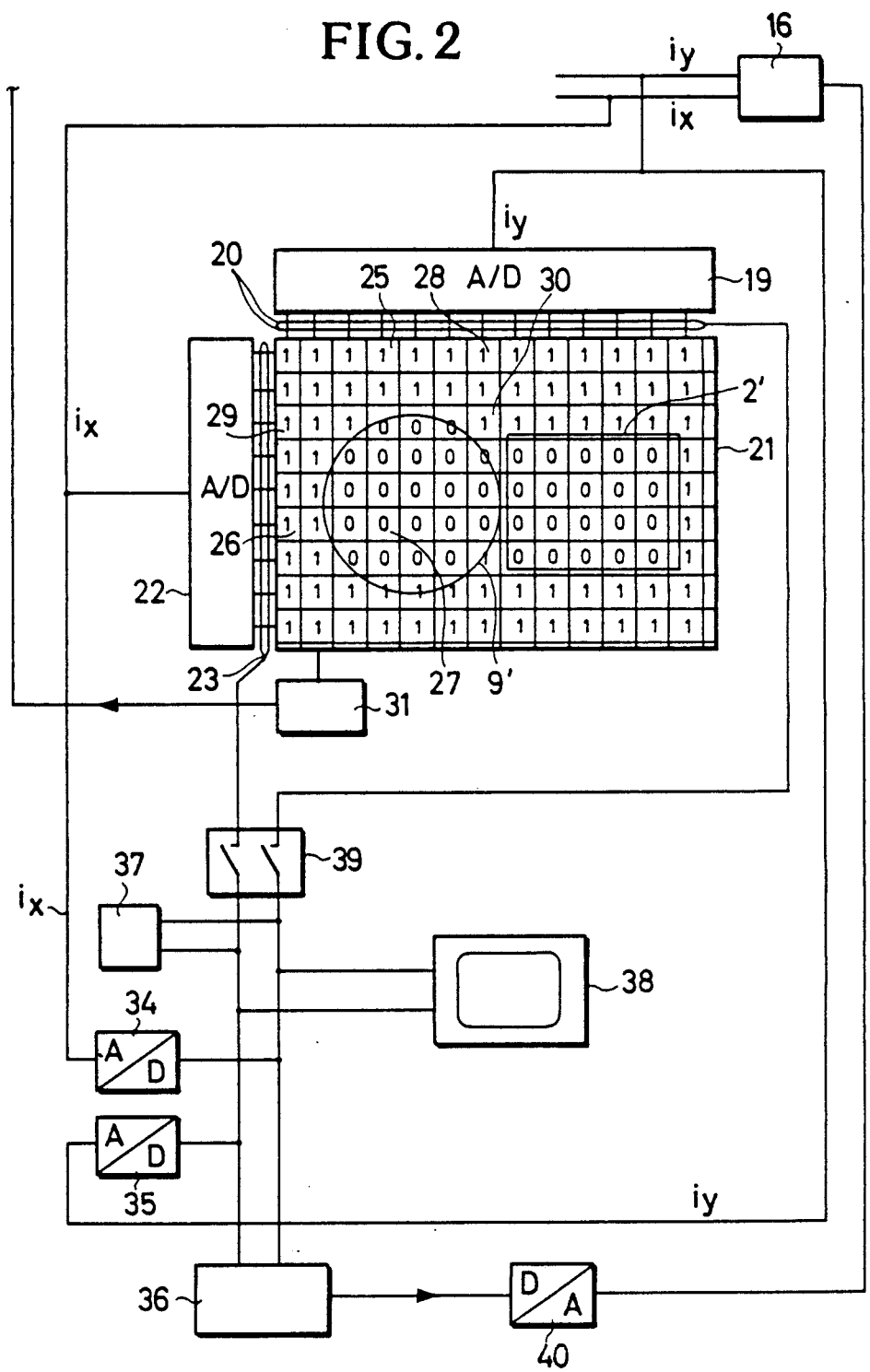

An embodiment example of the invention is represented in the drawing and is described below in greater detail. Therein FIG. 1 represents a device for the control and monitoring of an electron beam;

FIG. 2 a device according to FIG. 1 which comprises a computer and at least one supplementary memory.

In FIG. 1 a metal strand to be melted which is moved in the direction toward an intermediate pan 2 and above which an electron gun 3 is located whose electron beam 4 melts off the metal rope 1. The electron beam 4 can be deflected and thus permits keeping liquid the melted off metal in the front region 5 of the intermediate pan 2. In the rear area 6 of the intermediate pan 2 a further electron gun 7 is provided which keeps liquid the molten material 8 before being poured out of the intermediate pan 2 into a continuous casting crucible 9. A third electron gun 10 keeps liquid the molten material poured into the continuous casting crucible 9 with an additional heating device 11 being provided at the upper edge of the crucible 9. With this arrangement it is possible to undertake a separation by gravity of undissolved components in the melting bath. The heavy inclusions sink to the bottom of the intermediate pan 2 and cannot surmount the dam 24 in front of a delivery lip 12. The light slag particles 13 floating on the melting bath are held back by a cooled metal pipe 14 functioning as stripper; they thus do not reach the melting bath of the continuous casting crucible 9. Through appropriate distribution of the electron beam power on the melting bath of the intermediate pan 2 the bath depth can be kept so shallow that due to the then low hydrostatic pressure an optimal degassification corresponding to the vacuum pressure is possible.

The energy supply of the electron gun 3, 7, 10 takes place via a high voltage device 15. For the x-y control of the electron gun beams a control device 16 is provided in each instance whose control lines 17, 18 in FIG. 1 for the sake of simplicity are only led to the electron gun 7. Corresponding separate control lines are also led onto the electron gun 3 and/or 10. Via the control lines 17, 18 deflection currents $i_x$, $i_y$ are given which determine the impingement point of an electron beam on the molten material 8. The analog deflection current $i_x$ can be supplied to an analog-to-digital converter 22 which converts the analog $i_x$ value into a digital value and feeds via lines 23 to the x rows of a memory 21 which is structured in the manner of a matrix. In corresponding manner the analog current $i_y$ can be converted via a second analog-to-digital converter 19 into a digital signal and fed via lines 20 to the y-columns of the memory 21.

The memory 21 is preferably an electronic RAM memory; it is, however, also possible to use any other memory which can be written and read, for example an EEPROM memory. The allowed zones in which the electron beams of the electron guns 3, 7, 10 are permitted to move are defined by the outer contours of the crucible 9 or the intermediate pan 2. An electron beam may not reach outside of these contours. Since, however, the action radius of an electron beam is greater than the allowed area, measures must be taken in order to prevent going beyond the allowed area.

For this purpose the contours of the allowed areas are represented in memory 21. For imaging the "1" or "0" data respectively serve which define a contour where they border on each other.

In memory 21 the contours of crucible 9 and of the intermediate pan 2—even if stylized—are represented by the reference numbers 9' and 2'. All allowed areas are provided with a "0" datum while all forbidden areas are provided with a "1" datum.

However, the $i_x$-, $i_y$ values for the electron beam impingement points often give only imprecise information about the actual impingement point. For that reason it is better to select for accessing a memory the position values $P_x$, $P_y$ instead of the deflection currents $i_x$, $i_y$. These actual values $P_x$, $P_y$ are determined for example by means of an actual-position value recognition device 32 which detects and evaluates the X-rays 33 originating upon the electrons impinging on matter. In the device 32 is located a position-sensitive detector, for example a lateral diode as well as a special evaluation circuit which supplies $P_x$- and $P_y$-position signals. Details of this device are described in the European Patent publication No. EP-A1-0 184 680. In FIG. 1 only to the electron beam gun 7 an actual-position value recognition device 32 is assigned. Correspondingly, however, the other electron beam guns 3, 10 can also have assigned to them an actual-value recognition device.

By using a device which determines precisely the actual value of the impingement position of the electron beam, it can be ascertained with great certainty whether or not the electron beam is still within or already outside the allowed areas.

For the actual-position value input an independent memory 41 is provided which is structured in the same way as the memory 21. It is connected with analog-to-digital converters 42, 43 which convert the analog actual-position values into digital values. Both memories 21, 41 can be used individually. It is, however, particularly advantageous to use them together. Should the more precise actual-position value fail it is possible to switch over to the deflection currents. For such a switchover, a changeover switch 44 is provided which one time connects the memory 41 and another time the memory 21 with a device 31 which is connected to the high voltage device 15.

In conjunction with FIG. 2 the input of data into a memory 21, 41 is described in further detail only with reference to memory 21 for the sake of clarity. However, the explanations apply in corresponding manner to memory 41 also.

It may be assumed that the $i_y$-value is such that the vertical column 25 is accessed while due to the $i_x$-value the horizontal line 26 is acted upon. In this case both signals coincide in point 27, where a "0" datum is located. This means that the electron beam is within the allowed zone.

If the particular deflection current $i_y$ accesses the column 28 while the particular deflection current $i_x$ accesses line 29, the values of the two currents meet in point 30, which characterizes a forbidden area because there a "1" is stored. This meeting of the x- and y-signals in a "1" point is recognized by the device 31 which sends a signal to the high-voltage device 15 and separates it abruptly from the electron gun 7. Thus, damage is avoided from the electron beam straying from the allowed area.

Up to now the assumption was made that the areas of crucible 9 or intermediate pan 2 respectively are already filed in memory 21. Below it is described how the input of the contours into a memory 37 and the input of the areas into the memory 21, which has for example 256×256 memory locations takes place.

The electron beam of an electron gun, for example of electron gun 7, is moved manually from the interior region of the crucible toward the edge or toward the outer contour of this crucible. Since the electron beam has only measuring functions it can be considerably weaker than during normal metal melting operation. When the electron beam has reached the crucible edge, a key can be depressed and the actual-deflection current value $i_x$, $i_y$ can be supplied via a digital-to-analog converter 34, 35 to a computer 36.

This process is repeated for several prominent points along the crucible edge and the particular coordinates are supplied to the computer 36. The various points are subsequently filled in through interpolation by the computer to form a closed curve. The interpolation method should herein not only be able to connect the stored points linearly with each other but also permit the representation of a round crucible shape by storing only a few supporting values. In order to connect via a curve several points in a cartesian system of coordinates to form a function f(x), several methods are possible, for example Newton's interpolation algorithm which is suitable for functions with a small number of supporting points. If, on the other hand, the function has for example 20 supporting points then through these points a curve equation is calculated which is already of 21th order. Since, apart from the fixing at the supporting points no further requirements are made of the Newton polynomial, at a greater number of supporting points this oscillates in the region between two values.

In this case application of interpolating Spline functions is recommended. A function f(x) becomes an interpolating Spline function of kth order if f(x) is continuously (k−1)-times differentiable, is given between two supporting values by a polynomial of maximally kth order, and the interpolation property $f(x_i)=y_i$ for $i=0, 1,\ldots n$ is fulfilled (cf. c't 1987, No. 6, p. 120 ff: "Auf die krumme Tour", Cubic SPLINE interpolation in TURBO-PASCAL).

For optimum location of the contours both methods of interpolation—the Spline method and the linear method—can be applied in combination.

The contour calculated by the computer 36 is now filed in memory 37 and when needed represented on a monitor 38. An area-filling routine can now calculate in the computer 36 the content of all area elements of memory 21. Via the gate circuit 39 the memory 21 is subsequently written. After delivery the computer 36 is free for further control tasks, i.e. it can send commands to control drive 16 via a digital-to-analog converter 40, or be removed completely. The calculated curve progression of the crucible shape during the graphic representation on the monitor 38 is already in the contour memory 37, with the entire crucible area being visible on an area of 256×256 screen pixels.

Thus by using a memory 21 in which the planes of the allowed areas for the impingement site of an electron beam are filed the computer 36 is considerably relieved of load so that it is available for other tasks. Only during the starting phase of an electron beam melting installation is the border of the working zone input into the computer 36 with the aid of the Teach-In method. After the translation of this border the entire field of coverage of the position detector 32 or the field of action of the electron beam is divided into forbidden and allowed working zones and laid down as x-y matrix in memory 21. During the melting process the actual x and y positions are placed into memory 21 which supplies the information "allowed/forbidden". The device according to the invention permits in this manner carrying out the actual monitoring of the electron beam without placing a load on the computer 36. During a time interval of approximately one second the computing work is completed before the beginning of the melting process in that the learned contour in an area and therefrom the area elements are divided into forbidden and allowed residing zones. A good resolution is already achieved with 256×256 memory elements which can be realized through a single integrated RAM memory IC. In FIGS. 1 and 2 only a few of these memory elements are represented by example. If the currently simplest RAM memory is used then for the query, approximately 500 ns are required whereas the query time can be lowered to below 50 ns by using high-speed memories.

The organization 256×256 memory locations of memory 21 is suggested thereby that the two actual-deflection current values $i_x$, $i_y$ are resolved into eight bits each. Memories with this memory capacity are readily available as 64 kbit memories which, apart from different control inputs, have 16 address inputs and one data input and output each.

FIG. 2 has been described in conjunction with the actual-deflection current values $i_x$, $i_y$. It should be understood, however, that the preprocessing of the output signals $P_x$, $P_y$ of the actual-position value recognition device 32 can take place in corresponding manner.

What is claimed is:

1. An improved device for the control and monitoring of a deflectable electron beam for metal working which has a given region of action, wherein said region of action includes a first region being allowed for said electron beam and a second region being forbidden for said electron beam, said electron beam being switched off or brought back into the allowed region whenever it is in a forbidden region, the improvement being characterized in that:
   said first and second regions are areas on a metallic surface and are defined by contours;
   a first memory is provided comprising a plurality of storing elements capable of storing two different types of data for delineating said region of action of said beam, wherein a first area of said first memory the storing elements store a first type of data, and in a second area of said first memory the storing elements store a second type of data, a border between said areas of said first memory serving to differentiate between said allowed and forbidden regions;
   means for detecting the actual position of the electron beam and for generating digital data defining a position within said first memory;
   means for detecting whether the digitally defined position lies within said allowed region or within said forbidden region of said first memory.

2. Device as stated in claim 1, characterized in that the allowed memory regions are occupied by a first type of data, for example "0", while the forbidden memory regions are occupied by a second type of data, for example "1".

3. Device as stated in claim 1, characterized in that the electron beam is supplied via a control device with deflection currents ($i_x$, $i_y$), with the particular deflection current ($i_x$, $i_y$) representing the point of impingement of the electron beam, that the deflection current ($i_x$, $i_y$) is supplied to said first memory, and that subsequently if the impingement point lies within a forbidden region, the electron beam is switched off and/or brought back into the allowed region.

4. Device as stated in claim 1, characterized in that said means for detecting and generating said position data comprises a detector which recognizes the actual value ($P_x$, $P_y$) of the impingement point of the electron beam on matter and supplies this actual value ($P_x$, $P_y$) to said first memory wherewith, subsequently, if the actual value lies outside of the allowed area, the electron beam is switched off and/or brought back into the allowed area.

5. Device as stated in claim 1, characterized in that the stored contours defining said first and second regions correspond to the edges of containers, wherewith these edges for the position and/or associated deflection-current values are determined by means of a Teach-In method and filed in said first memory.

6. Device as stated in claim 5, characterized in that the Teach-In method is carried out by means of a computer.

7. Device as stated in claim 1, characterized in that the contours between allowed and forbidden regions are represented visibly on an optical display device.

8. Device as stated in claim 2, characterized in that said first memory, in which the allowed and forbidden regions are stored, is a RAM memory.

9. Device as stated in claim 2, characterized in that said first memory, in which the allowed and forbidden regions are stored, is an EEPROM memory.

10. Device as stated in claim 1, characterized in that a second memory is provided, wherein said first memory is acted upon by deflection currents ($i_x$, $i_y$) as electron beam actual-position values, said second memory is acted upon by actual-position values ($P_x$, $P_y$) from an actual-position value output, and a changeover switch is provided with which said first memory or said second memory is connected to a device for switching off the electron beam.

11. Method for the control of an electron beam, characterized by the following steps:

(a) scanning with an electron beam up to a first point of an apparatus edge and acquisition of the coordinates of this point;

(b) scanning with the electron beam up to a second point of the apparatus edge and acquisition of the coordinates of this point, as well as n-fold repetitions of the scanning up to the nth point and acquisition of the coordinates of this nth point;

(c) interpolation of the individual points to a closed edge in a computer (36) and storage of this edge in a first memory (37);

(d) calculation of the allowed and forbidden memory elements in a further memory (21, 41) on the basis of the contour stored in a first memory (37);

(e) writing of "1" or "0" data into the calculated memory elements;

(f) switching the computer (36) away from the memory (21, 41) and making the computer (36) available for other purposes;

(g) querying the memory (21, 41) via analog-to-digital converters (19, 22 and 42, 43 respectively) by means of digitized deflection currents or position data respectively and supplying a signal for switching off or moving away the electron beam if these values lie in a forbidden area.

12. Device for the control and monitoring of a deflectable electron beam for metal working which has a given are of action, characterized in that:

the area of action is divided into allowed and forbidden areas and the electron beam whenever it is in a forbidden area is switched off or brought back into the allowed zone; and two memories are provided of which the one is acted upon by deflection currents ($i_x$, $i_y$) as electron beam actual-position values, and the other by actual-position values ($P_x$, $P_y$) from an actual-position value output, and that a changeover switch is provided with which the one or the other memory is connected to a device for switching off the electron beam.

* * * * *